United States Patent [19]

Shiga

[11] Patent Number: 5,248,948
[45] Date of Patent: Sep. 28, 1993

[54] OSCILLATING CIRCUIT DEVICE WITH A VARIABLE CAPACITOR

[75] Inventor: Nobuo Shiga, Yokohama, Japan

[73] Assignee: Sumitomo Electric Industries, Ltd., Osaka, Japan

[21] Appl. No.: 872,998

[22] Filed: Apr. 24, 1992

[30] Foreign Application Priority Data

Apr. 26, 1991 [JP] Japan .................................. 3-96886

[51] Int. Cl.[5] .............................................. H03B 5/18
[52] U.S. Cl. .................. 331/96; 331/108 C; 331/117 FE; 331/117 D
[58] Field of Search ................. 331/96, 107 R, 108 R, 331/108 C, 117 R, 117 FE, 117 D; 357/22 A, 22 H, 23.3

[56] References Cited

U.S. PATENT DOCUMENTS 4,481,487 11/1984 Brehm et al. ...................... 357/22 H
4,905,061 2/1990 Ohmuro et al. .................. 357/22 A

FOREIGN PATENT DOCUMENTS 2343361 9/1977 France .

OTHER PUBLICATIONS

B. Roth et al, "A Varactor-Tuned Oscillator Using MMIVC Technology", *Microwave Journal*, vol. 33, No. 9, Dedham U.S., pp. 223-225, Sep. 1990.
M. G. McDermott et al, "monolithic Ka Band VCO Using Quarter Micron GaAs MESFETs and Integrated High-Q Varactors", *1990 IEEE MTT-S International Microwave Symposium Digest*, vol. 1, Dallas, Texas, U.S., May 8-10, 1990.
K. Ohata, "Microwave Heterojunction Devices", *19th European Microwave Conference 89*, Sep. 4-7, 1989, London, GB pp. 136-146.

*Primary Examiner*—David Mis
*Attorney, Agent, or Firm*—Beveridge, DeGrandi, Weilacher & Young

[57] ABSTRACT

The oscillating apparatus according to this invention includes a pulse doped FET 1, and a series feedback capacitor 2 connected to the source of the pulse doped FET 1. The pulse doped FET is a FET formed on a pulse doped epitaxial layer including a channel layer 23 with a high carrier density, and a cap layer 24 with a low carrier density formed on the channel layer 23. The series feedback capacitor 2 is a variable capacitor whose capacitance value increases when a gate bias voltage of the pulse doped FET 1 is changed to increase a drain current of the pulse doped FET 1. Consequently it is possible to reduce phase noises by controlling only the gate bias with an oscillation frequency set at a required value. As a result, the merits of the MMIC can be sufficiently utilized without the necessity of externally adding a dielectric resonator.

14 Claims, 4 Drawing Sheets

OSCILLATING CIRCUIT DEVICE WITH A VARIABLE CAPACITOR

BACKGROUND OF THE INVENTION

1. Field of the Invention

This invention relates to a local oscillating circuit device for use in converters and measuring equipment for satellite broadcasting receivers.

2. Related background Art

Accompanying the recent rapid development of information network systems, the demand for satellite communication and broadcasting systems has rapidly increased, and frequency bands are becoming higher. In order to satisfy these requirements, various circuit elements such as a field effect transistor, etc. which can be operated in a high frequency band have been studied and developed. A Schottky-barrier type electric field effect transistor (MESFET) formed of compound semiconductor has been used such as a field effect transistor for high frequency band. In addition, to reduce the size of the systems, reduce their prices and improve their performance, recently the integration (MMIC: Microwave Monolithic Integrated Circuit) of downconverter first-stage amplifiers for converting higher frequencies to lower frequencies is being advanced.

But in the local oscillators for use in converters and so on for satellite broadcasting receivers, the usual GaAs MESFETs having the active layer formed by ion implantation have been conventionally used, and GaAs MESFETs which are structurally arranged so that the bias voltage is optimized especially so as to make phase noises smaller have not been used.

Such conventional oscillators, using the above-described usual GaAs MESFET has too large phase noises as it is. This is due to the "low Q" which is intrinsic to the GaAs FET. The phase noise of the oscillator depends on various factors, and it is known that the phase noise much depends especially on low-frequency noises of the FET (which is one of the noises of 1/f because the spectrum is inversely proportional to a frequency), and the bias-dependency in further much also depends on the gate capacity Cgs. In view of this, to achieve low-phase noises, conventionally a dielectric resonator of a high dielectric constant has been externally added to obtain a required resonance spectrum. This is true with the MMIC resonator, and consequently the merits of the MMIC, such as miniaturization of the system, low costs thereof and so on, have not be able to be used.

SUMMARY OF THE INVENTION

This invention has been made to solve these problems. An object of this invention is to provide an oscillating circuit which has small phase noises and is small-sized.

To achieve this object, the oscillating apparatus according to this invention comprises a pulse doped FET, and a series feedback capacitor connected to the source of the pulse doped FET, the pulse doped FET being a FET formed on an epitaxial layer having pulse doped structure, including a channel layer with a higher carrier density and a cap layer with a lower carrier density formed on the channel layer, the series feedback capacitor being a variable capacitor whose capacitance value increases when a gate bias voltage of the pulse doped FET is changed to increase a drain current of the pulse doped FET.

The pulse doped FET can adjust phase noises by changing the gate voltage Vg. As mentioned above, in accordance with the gate voltage Vg, the capacitance of the series feedback capacitor also changes. Consequently the oscillation frequency does not change. That is, without changing an oscillation frequency the gate voltage adjustment can be made for the improvement of phase noises.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 1:
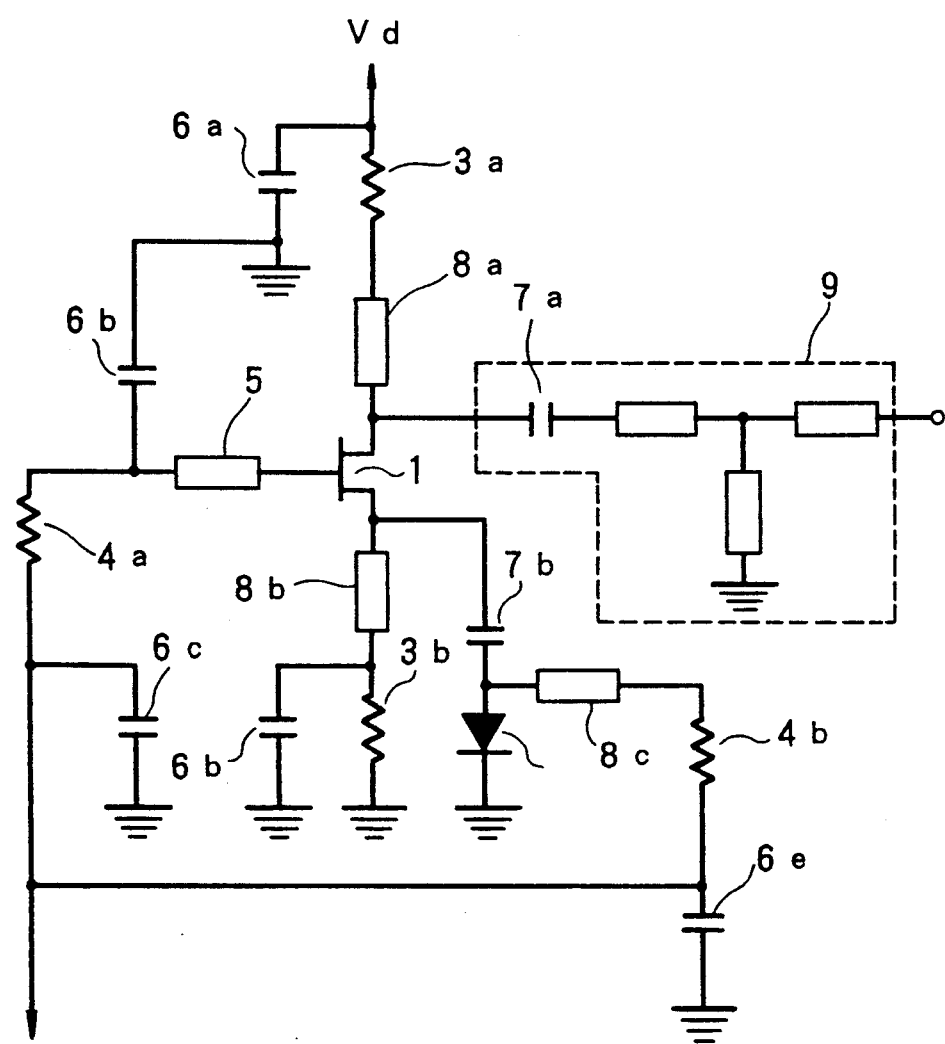
FIG. 1 is a circuit diagram of the oscillating circuit device according to one embodiment of this invention.

The oscillating circuit device of FIG. 1 is formed on a substrate comprising a semi-insulating GaAs substrate and epitaxial layers formed thereon by, e.g., OMVPE (Organic Metallic Vapor Phase Epitaxy).

This oscillating circuit device includes a pulse doped FET 1 as an active device, and a variable capacitance diode 2 as a series feedback capacitor connected to the source of the FET 1. The circuit of FIG. 1 works as an oscillating apparatus by setting the capacitance value of the variable capacitance diode 2 so that the impedance viewed from the terminal of the drain of the FET 1 is negative. By changing this capacitance value in accordance with a gate voltage of the FET 1, its oscillation frequency can be stabilized. To this end, in this embodiment a gate bias control voltage Vc for the FET 1 is applied to the anode of the variable capacitance diode.

A resistor 3a is for determining a drain-source voltage Vds, and a resistor 3b is for a self-bias for determining a drain current Id of the FET 1. A resistor 4a and a resistor 4b are protection resistors for prohibiting surge voltages from being applied to the gate of the FET 1 and the anode of the variable capacitance diode 2. λg/4 lines 8a to 8c are inserted as infinite resistors for signal frequencies. A stub 5 connected to the gate of the FET 1 is an inductor and a factor for determining an oscillation frequency. Condensers 6a to 6e are bypass condensers for letting out a.c. components only. Condensers 7a, 7b are d.c. blocking capacitors. The condenser 7a also functions as a part of an output matching circuit 9 which maximizes an oscillation output together with three stubs. Vd represents a source voltage, and Vc represents a gate bias control voltage.

Figure 2:
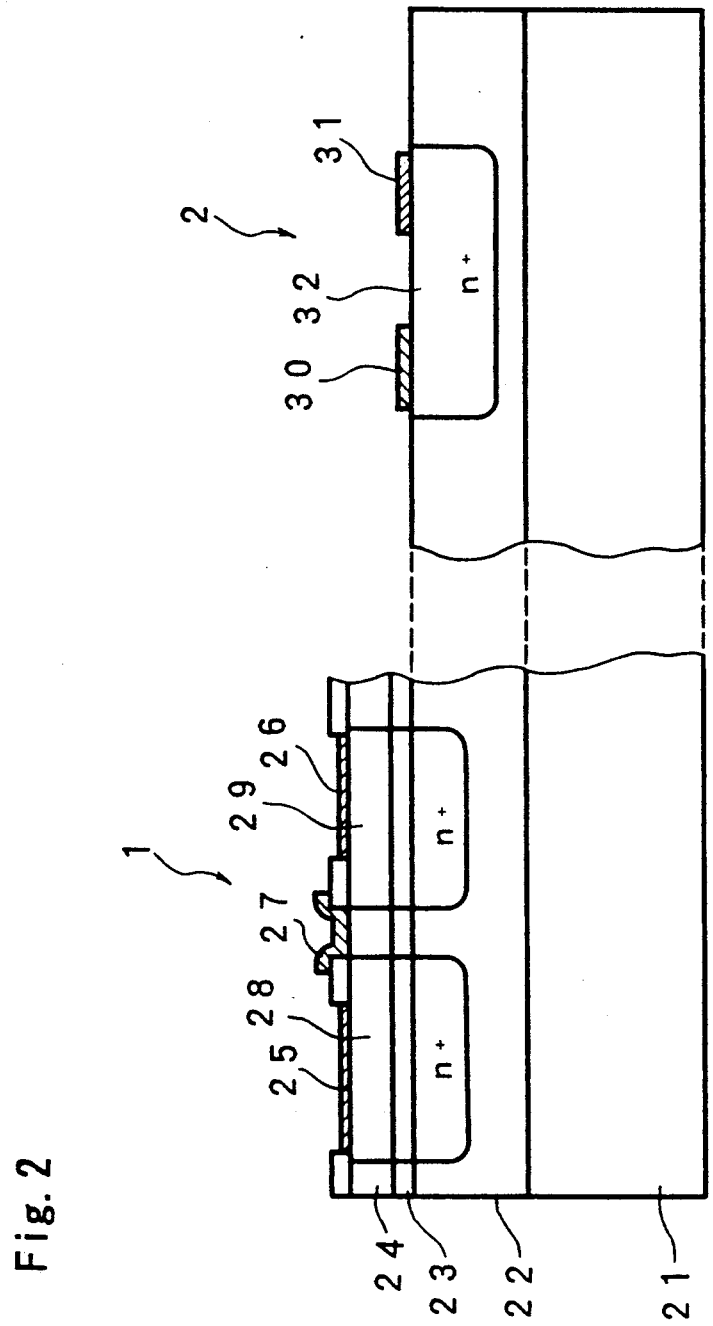
FIG. 2 is a sectional view of a FET and a variable capacitance diode involved in the embodiment of FIG. 1 mounted on a substrate.

FIG. 2 is a sectional view of the FET 1 and the variable capacitance diode 2 mounted on the substrate. A pulse doped epitaxial layer comprising an undoped GaAs layer (buffer layer) 22, Si doped GaAs layer (channel layer) 23, and an undoped GaAs layer (cap layer) 24 are formed on a semi-insulating GaAs substrate 21 by OMVPE or other techniques. The undoped GaAs layer 22 is formed in p-density of $2\times10^{15} cm^{-3}$ and a thickness of 10000 Å, the Si doped GaAs layer is formed in doping density of $4\times10^{18} cm^{-3}$ and a thickness of 100 Å, and the undoped GaAs layer 24 is formed in n-density of $1\times10^{15} cm^{-3}$ and a thickness of 300 Å.

Figure 3A:
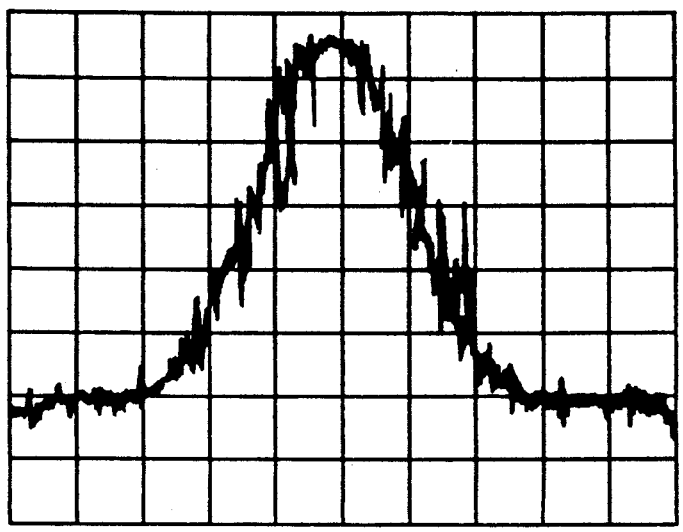
FIG. 3A is a characteristic oscillation spectrum of an oscillator using a usual MESFET having the active layer formed by ion implantation.
Figure 3B:
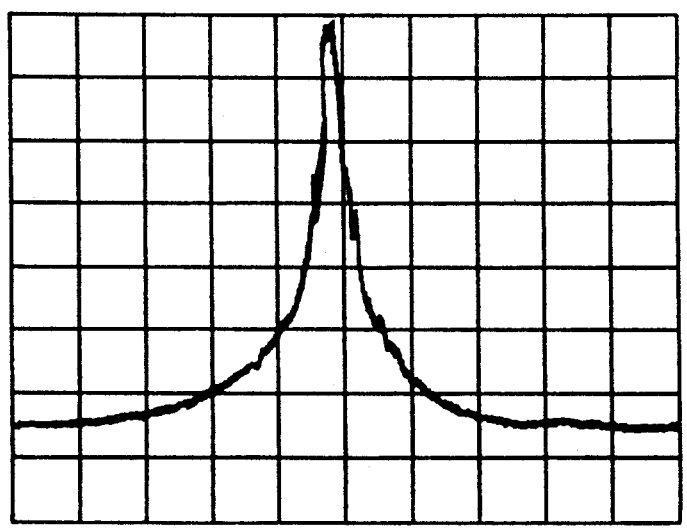
FIG. 3B is a characteristic oscillation spectrum of an oscillator using a pulse doped MESFET.

The pulse doped FET 1 is fabricated by forming a source electrode 25, a drain electrode 26, a gate electrode 27 and an n+contact regions 28, 29 on this pulse doped epitaxial layer. An oscillator using a GaAs MESFET formed on the pulse doped epitaxial layer comprising a thin channel layer with a high carrier density, and a cap layer with a low carrier density formed on the channel layer has smaller phase noises in comparison with an oscillator using a usual ion implanted MESFET. This is shown in FIGS. 3A and 3B. FIGS. 3A and 3B show examples of the oscillation spectrums of the two oscillators. FIG. 3A is the spectrum of the oscillator using a usual MESFET whose active layer formed by ion implantation, and FIG. 3B is the spectrum of the oscillator with the "pulse doped FET". In FIGS. 3A and 3B frequencies are taken on the horizontal axis and output power is taken on the vertical axis.

Figure 4:
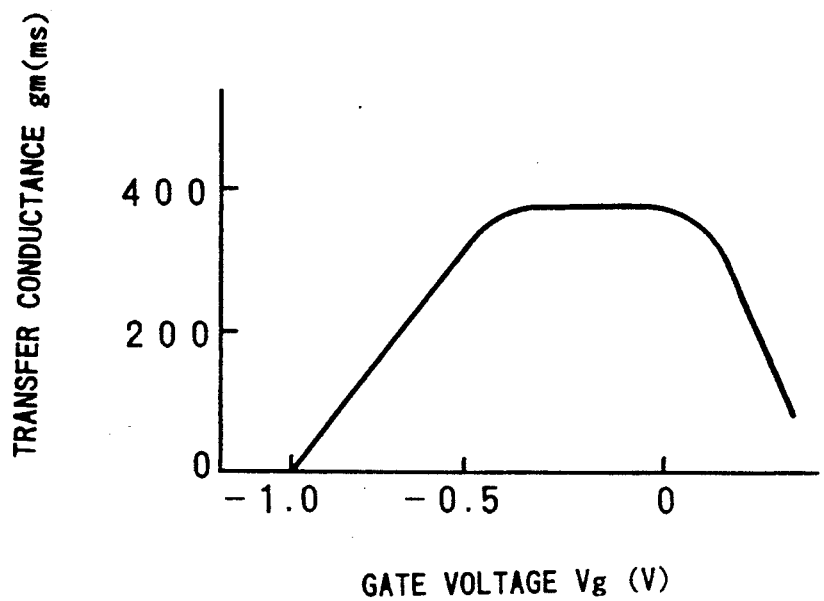
FIG. 4 is a view of the relationship between the transfer conductance gm and the gate voltage Vg of a pulse doped FET.
Figure 5:
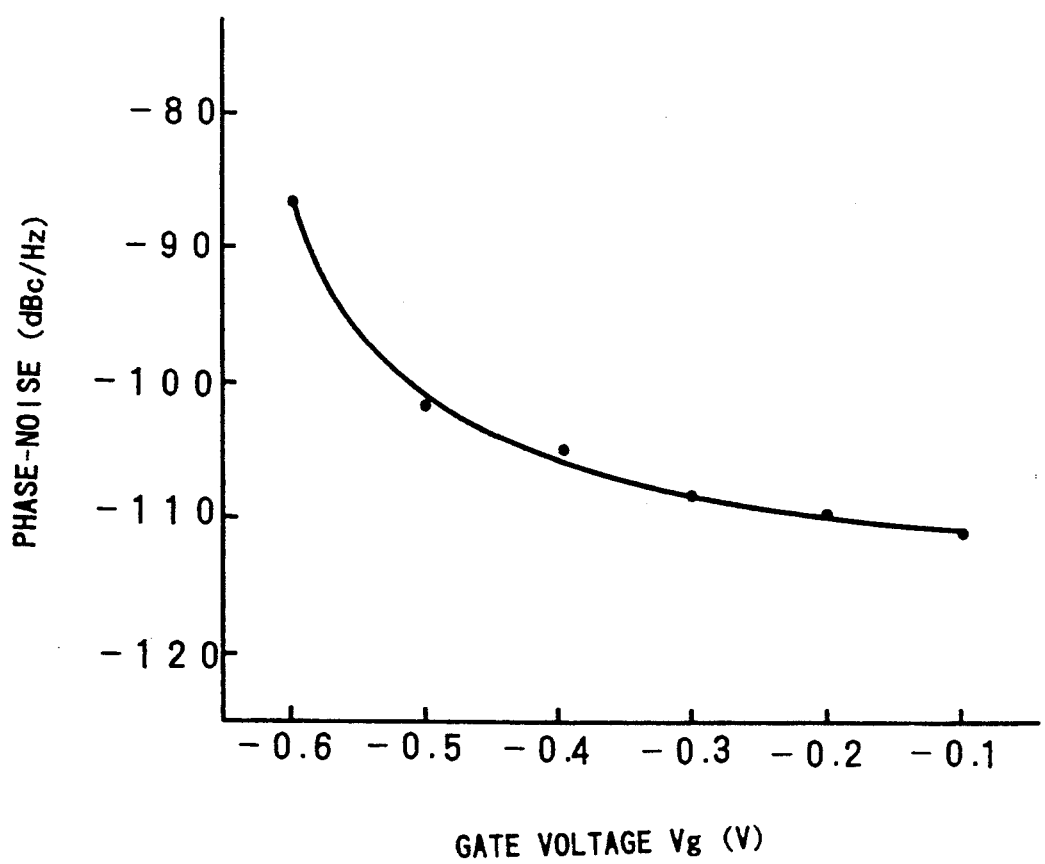
FIG. 5 is a view of the relationship between the gate voltage Vg and the phase noises of a pulsed dope FET.

Such low phase noise of the pulse doped FET is due to the very thin film and the high carrier density of the channel layer. As shown in FIG. 4, the relationship between the transfer conductance Gm and the gate voltage Vg has a flat part, which means that a carrier density does not substantially change. Consequently the gate capacitance Cgs does not substantially change with respect to the gate voltage Vg. It has been factually confirmed by experiments that as a bias voltage is gradually raised from a large minus range to increase of the drain current, phase noises decrease as shown in FIG. 5.

When a gate bias voltage is thus changed, a high-frequency characteristic (S parameter) of the FET itself adversely changes. Consequently a value of the series feedback capacitor necessary for the oscillation at a required frequency also adversely changes. In other words, when a gate bias voltage is changed with a value of the series feedback capacitor set constant, adversely a frequency changes.

According to a simulation, in the case an oscillating apparatus uses a pulse doped GaAs MESFET having, e.g., a 0.5 μm gate length and a 280 μm gate width, at an oscillation frequency of 10.7 GHz, the necessary value of the series feedback capacitor is 0.17 pF when biased so that the drain current is 24 mA. In contrast to this, when biased so that the drain current is 50 mA, the series feedback capacitor is as large as 0.22 pF. Thus, when the gate bias voltage of the FET is changed to increase the drain current, a value of the series feedback capacitor necessary for oscillation at a required frequency becomes large.

But according to the oscillating apparatus according to this invention, the series feedback capacitor's capacitance value accordingly increases when a bias voltage changes to increase a drain current. Resultantly it is impossible that phase noises can be improved by controlling a gate bias with an oscillation frequency kept constant.

The variable capacitance diode 2, which is the series feedback capacitor of this embodiment, as shown in FIG. 2, is fabricated on a buffer layer 22 exposed by etching a channel layer 23 and a cap layer 24. That is, this variable capacitance diode 2 is a Schottky barrier diode including an anode 30, a Schottky electrode, and a cathode 31, an ohmic electrode, formed on an active layer 32 formed by ion implantation ions in the buffer layer 22.

The variable capacitance diode 2 can be fabricated by various processes other than the process for the fabrication of this embodiment. Generally it is preferable to use a FET used in circuits because it simplifies the process. But the pulse doped FET used in this invention is not suitable, because the pulse doped FET is characterized in that a change of the gate capacitance respect to a gate bias is so small as described above that it will disadvantageously take a FET of a large area to use a pulse doped FET for the variable capacitance diode.

In contrast to this, since in the fabrication process of the pulse doped GaAs MESFET 1, n+contact regions 28, 29 are formed by ion implantation, at this time an active layer 32 of the Schottky barrier diode 2 is formed on the same conditions. Its acceleration voltage (90 KeV) and dose ($6\times10^{13} cm^{-2}$) are optimum for the variable capacitance diode used in this embodiment. Furthermore, since at the same time the n+contact regions are formed, the active layer of the Schottky barrier diode can be formed, the process can be simple.

As described above, this invention uses a pulse doped GaAs MESFET, and as a series feedback capacitor a variable capacitor whose capacitance value increases in accordance with a gate bias voltage when the gate bias voltage is changed to increase a drain current. Consequently it is possible to reduce phase noises by controlling only the gate bias with an oscillation frequency set at a required value. As a result, the merits of the MMIC can be sufficiently utilized without the necessity of externally adding a dielectric resonator.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. An oscillating apparatus, comprising:
   a pulse doped FET having a pulse doped epitaxial layer including a channel layer with a high carrier density, and a cap layer with a low carrier density;
   a direct current blocking condenser having two terminals, one of said terminals being connected to a source of said pulse doped FET; and
   a series feedback capacitor means including a variable capacitor diode having an anode connected to the other one of said terminals of said direct current blocking condenser and being connected electrically to a gate of said pulse doped FET so as to provide a feed back capacitor for said pulse doped FET.

2. An oscillating apparatus according to claim 1, wherein
the variable capacitor diode is a Schottky barrier diode, said variable capacitor diode having a capacitance which increases when a gate bias voltage of said pulse doped FET changes to cause drain current of said pulse doped FET to increase.

3. An oscillating apparatus according to claim 2, wherein
the Schottky barrier diode is formed on a substrate common with the pulse doped FET.

4. An oscillating apparatus according to claim 3, wherein
the active layer of the Schottky barrier diode is formed by ion implantation at the same acceleration voltage and dose as n+contact regions of the source and the drain of the pulse doped FET which are formed by ion implantation.

5. An oscillating apparatus according to claim 4, wherein
the active layer of the Schottky barrier diode is formed at the same time as the formation of the n+contact regions of the source and the drain of the pulse doped FET.

6. An oscillating apparatus according to claim 1, wherein
the substrate is a GaAs substrate.

7. An oscillating apparatus according to claim 1 wherein
the channel layer and the cap layer are epitaxial GaAs layers.

8. An oscillating apparatus according to claim 7, wherein
the channel layer and the cap layer are formed on the GaAs substrate through a buffer layer which is an epitaxial GaAs layer of a low carrier density.

9. An oscillating apparatus according to claim 1, wherein a capacitance value of said variable capacitor diode increases when drain current of said pulse doped FET increases and decreases when drain current of said pulse doped FET decreases, according to a change in gate bias voltage of said pulse doped FET.

10. An oscillating apparatus, comprising:
a pulse doped FET having a pulse doped epitaxial layer including a channel layer with a high carrier density, and a cap layer with a low carrier density;
a direct current blocking condenser having a first terminal and a second terminal, said first terminal being connected to a source of said pulse doped FET; and
a variable capacitor connected to said second terminal of said direct current blocking condenser, said variable capacitor having a capacitance value which depends on a bias voltage between two terminals of said variable capacitor.

11. An oscillating apparatus, comprising:
a pulse doped FET having a pulse doped epitaxial layer including a channel layer with a high carrier density, and a cap layer with a low carrier density;
a direct current blocking condenser having two terminals, one of said terminals being connected to a source of said pulse doped FET; and
a variable capacitor diode having an anode connected to the other one of said terminals of said direct current blocking condenser and to an input terminal to control a bias voltage of said gate pulse doped FET.

12. An oscillating apparatus according to claim 11, wherein said variable capacitor diode is a Schottky barrier diode.

13. An oscillating apparatus according to claim 12, wherein said Schottky barrier diode is formed on a substrate in common with said pulse doped FET.

14. An oscillating apparatus to claim 12, wherein the active layer of said Schottky barrier diode is formed by ion implantation at the same acceleration voltage and dose as n+contact regions of said source and said drain of said pulse doped FET which are formed by ion implantation.

* * * * *